(12) United States Patent
Zhang et al.

(10) Patent No.: US 10,191,531 B2
(45) Date of Patent: Jan. 29, 2019

(54) HYBRID CONVERTER SYSTEM

(71) Applicant: General Electric Company, Schenectady, NY (US)

(72) Inventors: Di Zhang, Niskayuna, NY (US); Rui Zhou, Niskayuna, NY (US); Xu She, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 34 days.

(21) Appl. No.: 14/983,010

(22) Filed: Dec. 29, 2015

(65) Prior Publication Data

US 2017/0185130 A1    Jun. 29, 2017

(51) Int. Cl.
*H02M 3/158* (2006.01)
*H02M 1/08* (2006.01)
*H01L 29/16* (2006.01)
*H02M 7/483* (2007.01)
*H02M 7/487* (2007.01)
(Continued)

(52) U.S. Cl.
CPC ............ *G06F 1/324* (2013.01); *G06F 1/3287* (2013.01); *H01L 29/1608* (2013.01); *H02M 1/08* (2013.01); *H02M 3/158* (2013.01); *H02M 7/483* (2013.01); *H02M 7/487* (2013.01); *H02M 7/5387* (2013.01); *H02M 2001/007* (2013.01); *H02M 2001/0054* (2013.01)

(58) Field of Classification Search
CPC ........... H02M 3/158; H02M 3/333507; H02M 3/3155; H02M 3/335; H02M 3/285; H02M 7/49; H02J 1/02; G05F 1/59
USPC .............. 363/65, 71, 95, 131; 323/268, 270; 307/43, 82
See application file for complete search history.

(56) References Cited

U.S. PATENT DOCUMENTS 5,262,932 A   11/1993   Stanley et al.
6,353,354 B1   3/2002   Detweiler et al.
(Continued)

FOREIGN PATENT DOCUMENTS

EP    2323249 A1    5/2011
FR    3001592 A1    8/2014
(Continued)

OTHER PUBLICATIONS

Vechalapu et al., "High voltage dual active bridge with series connected high voltage silicon carbide (SiC) devices", Energy Conversion Congress and Exposition (ECCE), 2014 IEEE, pp. 2057-2064, Sep. 14-18, 2014, Pittsburgh, PA.
(Continued)

*Primary Examiner* — Adolf Berhane
(74) *Attorney, Agent, or Firm* — GE Global Patent Operation; Nitin Joshi

(57) ABSTRACT

A voltage converter may include a first set of silicon (Si)-based power devices coupled to a first direct current (DC) voltage source and a second set of Si-based power devices coupled to a second DC voltage source. The voltage converter may also include a first set of silicon-carbide (SiC)-based power devices coupled to the first set of Si-based power devices and to the second set of Si-based power devices. Each SiC-based power device of the first set of SiC-based power devices may switch at a higher frequency as compared to each Si-based power device of the first and second sets of the Si-based power electronic devices.

21 Claims, 5 Drawing Sheets

(51) Int. Cl.
*H02M 7/5387* (2007.01)
*H02M 1/00* (2006.01)

(56) References Cited

U.S. PATENT DOCUMENTS

| | | | |
|---|---|---|---|
| 8,228,695 B2 * | 7/2012 | Roesner | H02M 7/487 363/131 |
| 8,730,696 B2 * | 5/2014 | Barbosa | H02M 7/483 363/132 |
| 8,830,711 B2 | 9/2014 | Lai et al. | |
| 8,848,405 B2 * | 9/2014 | Temesi | H02M 7/483 363/131 |
| 8,866,342 B2 | 10/2014 | Iwata et al. | |
| 8,908,402 B2 * | 12/2014 | Kopf | H02M 7/539 323/267 |
| 8,988,915 B2 * | 3/2015 | Ku | H02M 7/53871 363/132 |
| 2012/0201066 A1 | 8/2012 | Dubois et al. | |
| 2012/0218795 A1 * | 8/2012 | Mihalache | H02M 7/487 363/97 |
| 2013/0044527 A1 | 2/2013 | Vracar et al. | |
| 2013/0094265 A1 | 4/2013 | Lai et al. | |
| 2013/0121033 A1 * | 5/2013 | Lehn | H02M 3/335 363/17 |
| 2014/0375242 A1 | 12/2014 | Briere | |
| 2015/0016169 A1 | 1/2015 | Honea | |
| 2015/0084611 A1 | 3/2015 | Agrawal et al. | |
| 2015/0108958 A1 | 4/2015 | Xu et al. | |
| 2015/0311776 A1 | 10/2015 | Lavieville | |
| 2017/0373586 A1 * | 12/2017 | Zhang | H02M 7/5395 |

FOREIGN PATENT DOCUMENTS

| | | |
|---|---|---|
| JP | 2014003821 A | 1/2014 |
| WO | 2014194933 A1 | 12/2014 |

OTHER PUBLICATIONS

Nakajima et al., "Theoretical Loss Analysis of Power Converters with 1200 V Class Si-IGBT and SiC-MOSFET", PCIM Europe 2015; International Exhibition and Conference for Power Electronics, Intelligent Motion, Renewable Energy and Energy Management; Proceedings of, pp. 1-6, May 19-20, 2015,Nuremberg, Germany.

European Search Report and Opinion issued in connection with corresponding EP Application No. 16203747.7 dated Apr. 13, 2017.

Machine Translation and Notification of Reasons for Refusal issued in connection with corresponding JP Application No. 2016-243954 dated Jan. 30, 2018.

European Office Action issued in connection with corresponding EP Application No. 16203747.7 dated Jun. 7, 2018.

\* cited by examiner

HYBRID CONVERTER SYSTEM

BACKGROUND

The subject matter disclosed herein relates to voltage converter systems. More specifically, the present disclosure generally relates to using different types of switches in a voltage converter system to reduce losses and improve efficiency.

Silicon carbide (SiC) is a semiconductor that is increasingly being used in power electronic devices such as metal-oxide-semiconductor field-effect transistor (MOSFETs). SiC power electronic devices generally have relatively low switching losses at relatively high switching rates (e.g., kilohertz (kHz) range), operate at relatively high junction temperatures, and operate at relatively high voltages as compared to other power electronic devices that do not employ silicon carbide within the respective device. As such, SiC power electronic devices have gained interest in recent years in view of their switching performance and high temperature operation capabilities. However, since the costs of manufacturing SiC power electronic devices are not comparable to other power electronic devices, other silicon-based power electronic devices are used as a low cost alternative to using systems having SiC power electronic devices.

BRIEF DESCRIPTION

In one embodiment, a voltage converter may include a first set of silicon (Si)-based power devices coupled to a first direct current (DC) voltage source and a second set of Si-based power devices coupled to a second DC voltage source. The voltage converter may also include a first set of silicon-carbide (SiC)-based power devices coupled to the first set of Si-based power devices and to the second set of Si-based power devices. Each SiC-based power device of the first set of SiC-based power devices may switch at a higher frequency as compared to each Si-based power device of the first and second sets of the Si-based power electronic devices.

In another embodiment, an apparatus that converts a direct current (DC) voltage signal into an alternating current (AC) voltage signal may include a first set of silicon-carbide (SiC)-based power electronic devices coupled to a first direct current (DC) voltage source and a second set of silicon-carbide-based power electronic devices coupled to a second direct current (DC) voltage source. The apparatus may also include a first set of silicon-based power electronic devices coupled to the first set of SiC-based power electronic devices and to the second set of SiC-based power electronic devices, wherein each SiC-based power electronic device of the first and second sets of SiC-based power electronic devices is configured to switch at a higher frequency as compared to each silicon-based power electronic device of the first set of the Si-based power electronic devices.

In yet another embodiment, a voltage converter may include a first set of silicon (Si)-based power devices coupled to a first DC voltage source and a second set of Si-based power devices coupled to a second DC voltage source. The voltage converter may also include a first set of silicon-carbide (SiC)-based power devices coupled to the first set of Si-based power devices and to the second set of Si-based power devices. The voltage converter may also include a processor that may control switching of each SiC-based power device of the first set of SiC-based power devices and each Si-based power device of the first and second sets of the Si-based power devices, such that one SiC-based power device of the first set of SiC-based power electronic devices is conducting current in series with one Si-based power electronic device of the first or second set of the silicon-based power electronic devices at any given time.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
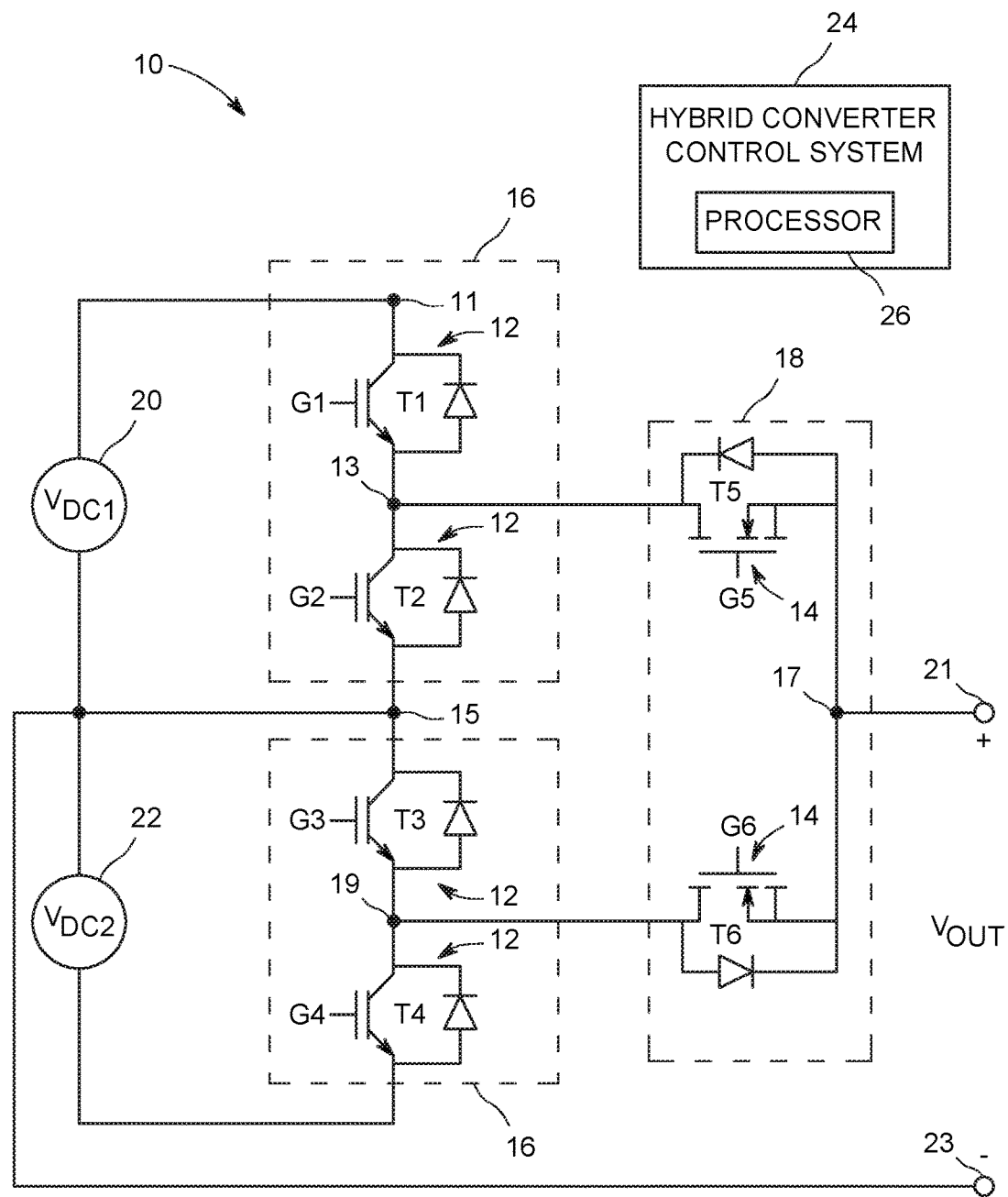
FIG. 1 is a schematic diagram of a three-level hybrid converter system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Silicon (Si) power electronic devices are widely used in various power conversion systems (e.g., rectifiers, inverters) to convert voltage signals from alternating current (AC) voltage signals to direct current (DC) voltage signals, and vice versa. However, silicon-based power electronic devices, such as silicon insulated-gate bipolar transistors (IGBTs), may lose an increasing portion of their energy as heat loss during high-frequency switching. As such, the performance of silicon-based power electronic devices maybe limited to some switching frequency (e.g., 1 kHz).

In contrast to silicon-based power electronic devices, silicon carbide-based power electronic devices, such as silicon carbide metal-oxide-semiconductor field-effect transistors (MOSFETs), may exhibit significantly lower switching losses as compared to silicon-based power electronic devices. As such, SiC power electronic devices may operate more efficiently than Si power electronic devices when switching frequently (e.g., >1 kHz) and at higher temperatures.

Although the switching losses for Si power electronic devices may be larger than the switching losses for SiC power electronic devices, the conduction losses (or the voltage drop) across the Si power electronic devices may remain relatively constant or increase at a slower rate as compared to the conduction losses for the SiC power electronic devices. That is, due to the structure of Si power electronic devices, such as Si IGBTs, the voltage drop across the Si power electronic device may generally be lower as compared to the SiC power electronic device, such as the SiC MOSFET, for the same current rating.

With the foregoing in mind, in one embodiment, both Si power electronic devices and SiC power electronic devices may be used together in a circuit to perform power conversion operations more efficiently. That is, a presently disclosed hybrid converter system generally employs Si power electronic devices that switch within a certain low frequency range (e.g., 0-1 kHz, line frequency, fundamental frequency) along with SiC power electronic devices that switch at a higher frequency range (e.g. >1 kHz). By switching the Si power electronic devices at a line or fundamental frequency and using SiC power electronic devices to switch at high frequencies, the hybrid converter system may produce a high quality voltage output that maximizes the benefit of the low switching loss properties of the SiC power electronic devices. Moreover, the hybrid converter system may coordinate gate signals provided to the Si power electronic devices and the SiC power electronic devices, such that the Si power electronic devices may carry zero current while they are switching. As such, the Si power electronic devices may have no switching loss.

By way of introduction, FIG. 1 illustrates a schematic diagram of a three-level hybrid converter system 10 that incorporates both Si power electronic devices and SiC power electronic devices to convert DC voltage signals to AC voltage signals, in accordance with an embodiment of the present approach. The three-level hybrid converter system 10 (hybrid converter system 10) may be characterized as an active neutral point clamped multilevel converter with hybrid switch assembly that uses both Si power electronic devices and SiC power electronic devices. It should be noted that the schematic diagram of FIG. 1 may represent one phase leg of a multi-phase converter system. As such, the three-level hybrid converter system 10 may be employed on one or more legs of such a multi-phase converter system.

In one embodiment, the Si power electronic devices and the SiC power electronic devices of the hybrid converter system 10 may be Si IGBTs 12 and SiC MOSFETs 14, respectively. The Si IGBTs 12 may include various types of IGBTs of different ratings (e.g., 1.7 kV, 3.3 kV, 4.5 kV, or 6.5 kV IGBT) that uses Si as the semiconductor material to switch between conductive to non-conductive states. In the same manner, the SiC MOSFETs may include various types of MOSFETs of different ratings that uses SiC as the semiconductor material to switch between conductive to non-conductive states. Although the following descriptions of various hybrid converter systems will be discussed with regard to illustrated the Si IGBTs 12 and the SiC MOSFETs 14, it should be noted that, in other embodiments, any suitable type of Si power electronic devices and SiC power electronic devices may be used in lieu of the Si IGBTs 12 and the SiC MOSFETs 14.

In some embodiments, multiple Si IGBTs 12 may be grouped together as part of a module 16. For example, in the hybrid converter system 10, two Si IGBTs 12 may be electrically coupled in series with each other and provide three interconnection nodes (e.g., 11, 13, 15) where the module 16 may be coupled to other electrical components. The interconnection nodes may be located at a collector side of one of the Si IGBTs 12, at an emitter side of one of the Si IGBTs 12, and in between two Si IGBTs 12.

In the same manner, multiple SiC MOSFETs 14 may be grouped together as part of a module 18, such that two SiC MOSFETs 14 may be electrically coupled in series with each other. Moreover, the module 18 may also have three interconnection nodes (e.g., 13, 17, 19) where the module 18 may be coupled to other electrical components. The interconnection nodes of the module 18 may be located at a drain side of one of the SiC MOSFETs 14, at a source side of one of the SiC MOSFETs 14, and in between two SiC MOSFETs 14.

Both the module 16 and the module 18 may be standardized, interchangeable components that may be used to build the hybrid system 10, in certain embodiments. As such, the module 16 and the module 18 may each be manufactured individually and be made available for assemblers to create different hybrid converter systems having different voltage and current ratings using standard building components.

With this in mind, each Si IGBT module 16 of the hybrid converter system 10 may be coupled across a DC voltage source (e.g., DC voltage source 20, DC voltage source 22). The intersection node (e.g., 13, 19) or output of each Si IGBT module 16 may then be coupled in series with the SiC MOSFET module 18. For instance, the interconnection node in between two Si IGBTs 12 of the modules 16 may be coupled to a source side and a drain side of the SiC MOSFETs of the module 18.

The AC output voltage of the hybrid converter system 10 may be provided at the output terminals (e.g., 21, 23), which are connected to the interconnection node (e.g., 17) between the SiC MOSFETs of the module 18 and to the interconnection node (e.g., 15) between the voltage source 20 and the voltage source 22. In some embodiments, the voltage source 20 and the voltage source 22 both provide the same amount of DC voltage. As such, the Si IGBTs 12 and the SiC MOSFETs 14 may be switched on and off in a controlled manner to convert a DC voltage signal provided via the voltage sources 20 and 22 to an AC voltage signal output by the hybrid converter system 10. The AC voltage signal output may then be provided to various types of AC powered devices, such as AC motors and the like, to perform various types of operations.

In one embodiment, the switching of the Si IGBTs 12 and the SiC MOSFETs 14 may be controlled by gate signals provided to gates of the Si IGBTs 12 and the SiC MOSFETs 14. As such, the hybrid converter system 10 may include a hybrid converter control system 24, which may provide gate signals to each of the Si IGBTs 12 and the SiC MOSFETs 14 in the hybrid converter system 10 to control operation of the hybrid converter system 10.

The hybrid converter control system 24 may generally include a processor 26 that determines appropriate gate signals to provide to the Si IGBTs 12 and the SiC MOSFETs 14 of the hybrid converter system 10 to produce a desired AC voltage output signal using the DC voltage sources 20 and 22. The processor 26 may be any type of computer processor or microprocessor capable of executing computer-executable instructions (e.g., software code, programs, applications). The processor 26 may also include multiple processors that may cooperate to perform the operations described below.

Figure 2:
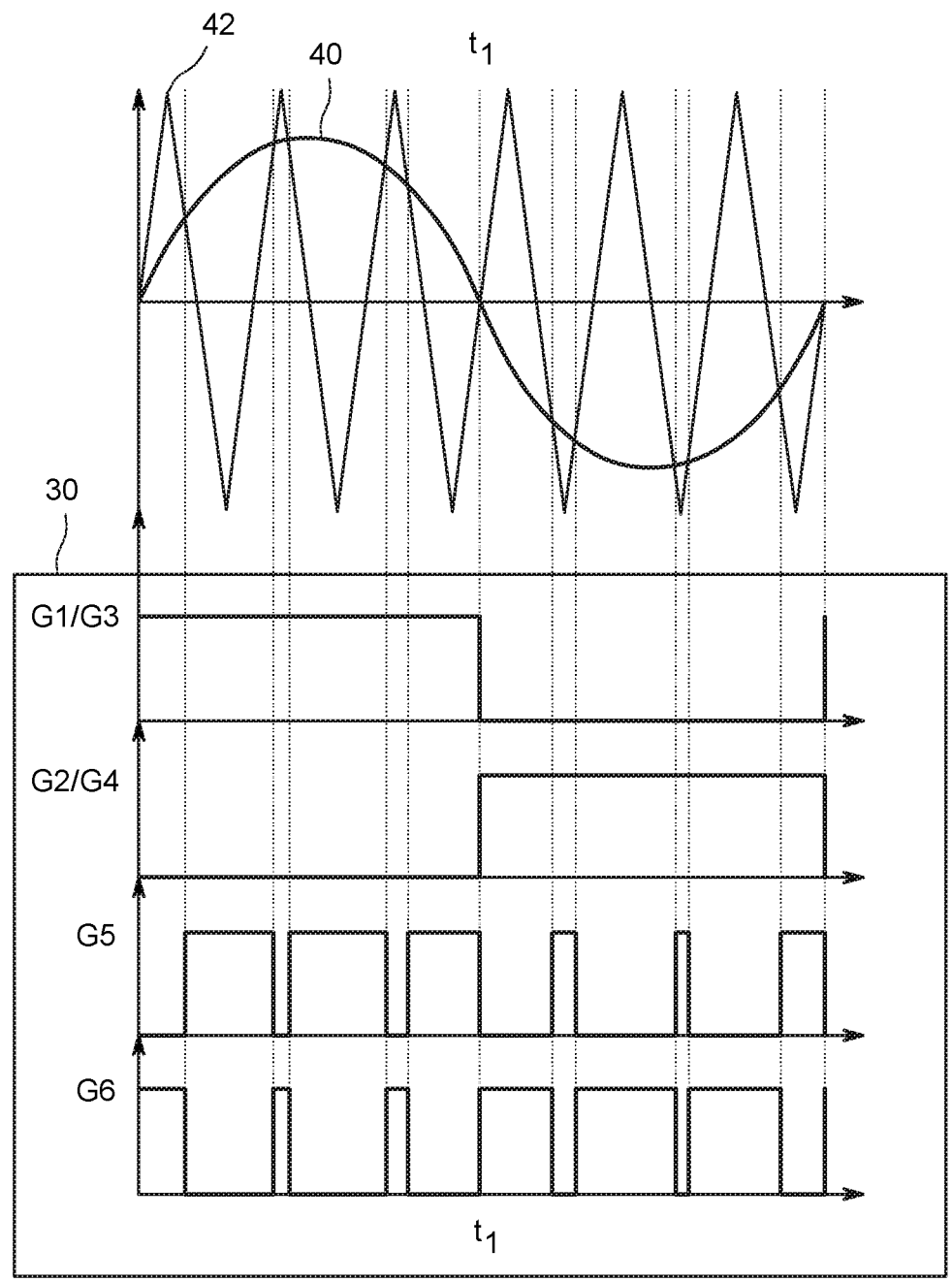
FIG. 2 is graph of voltage signals output by the hybrid converter system along with a timing diagram of gate signals provided to switching devices in the hybrid converter system of FIG. 1, in accordance with an embodiment.

Generally, as discussed above, the processor 26 may execute software applications that include programs to determine gate signals to provide to the Si IGBTs 12 and the SiC MOSFETs 14, such that the resulting AC voltage output corresponds to a desired voltage signal. For example, FIG. 2 illustrates an example timing diagram 30 of gate signals provided to respective gates of the Si IGBTs 12 and the SiC MOSFETs 14 for the embodiment of the hybrid converter system 10 of FIG. 1.

In certain embodiments, the processor 26 may provide gate signals to the Si IGBTs 12 and the SiC MOSFETs 14 such that one Si IGBT 12 will be in series with one SiC MOSFET 14 at any given time. Additionally, the processor 26 may send gate signals to the Si IGBTs 12 to cause the Si IGBTs 12 to switch at a fundamental line frequency (e.g., 60 Hz) and send gate signals to the SiC MOSFETs 14 to switch at a higher frequency (e.g., >1 kHz) to synthesize the desired AC voltage output waveform. Accordingly, as shown in FIG. 2, the gate signals (e.g., G1, G2, G3, G4) provided to the Si IGBTs 12 change less frequently as compared to the gate signals (e.g., G5, G6) provided to the SiC MOSFETs 14. As a result, AC voltage output 40 (reference wave) may correspond to a desired sine wave, as depicted in FIG. 2. FIG. 2 also depicts a carrier wave 42. The intersection of the carrier wave 42 and the AC voltage output 40 generally forms a square waveform or a pulse width modulation (PWM) gate waveform, which can be used to control the Si IGBTs 12 and the SiC MOSFETs 14.

With the foregoing in mind, to produce the AC voltage output 40, the processor 26 may coordinate the gate signals provide to the Si IGBTs 12 and the SiC MOSFETs 14 such that one Si IGBT 12 will be activated together in electrical series with one SiC MOSFET 14 at any given time and conduct current in series with each other, as discussed above. For example, referring to FIG. 1, switch T1 (e.g. Si IGBT 12) and switch T5 (e.g., SiC MOSFET 14) may be in series with each other during some time interval. To ensure that just one Si IGBT 12 is in series with a SiC MOSFET 14 at a given time (e.g., one Si IGBT 12 is conducting current in series with a Si MOSFET 14), the processor 26 may remove (e.g., stop or discontinue) a gate signal (e.g., at time $t_1$) from one Si IGBT 12 when turning the one Si IGBT 12 off and provide a gate signal to another Si IGBT 12 to turn the other Si IGBT 12 on with a short delay (e.g., dead time, approximately 1 μs, is provided in which both IGBTs are off to avoid a potential shoot through). In one embodiment, the processor 26 may remove and provide the respective gate signals when the AC voltage output 40 crosses zero (at time $t_1$).

However, when the gate signal is removed from a respective Si IGBT 12 and the Si IGBT turns off or enters a non-conductive state, the corresponding SiC MOSFET 14 that was coupled in series with the respective Si IGBT 12 will already be turned off. That is, the corresponding SiC MOSFET 14 may be in a non-conductive state sooner than its corresponding Si IGBT 12. As such, when the gate signal of the corresponding Si IGBT 12 is removed, the current in the Si IGBT 12 is already zero due to the SiC MOSFET 14 already being off. As a result, the Si IGBT 12, which traditionally has higher switching losses as compared to SiC MOSFETs, has little or no loss during turn off.

In the same manner, when a gate signal for another Si IGBT 12 is provided to turn on the Si IGBT 12, a corresponding SiC MOSFET 14 will not be turned on until corresponding Si IGBT 12 is completely on and in a full conductive (e.g. on) state. At this time (e.g., time $t_1$), the current in the respective Si IGBT 12 is still zero until the voltage across the Si IGBT 12 is almost zero. As such, the turn-on loss in the Si IGBT 12 is also minimized, resulting in little or no (e.g., zero) switching loss.

It should be noted, that by using the hybrid converter system 10 described above, the converter system is more efficient than a converter system that uses just SiC power electronic devices. For example, FIG. 3 illustrates a bar graph 50 that compares energy losses for a two-level converter system using just SiC power electronic devices (e.g., bar 52), a three-level converter system using just SiC power electronic devices (e.g., bar 54), and a three-level hybrid converter system that corresponds to the hybrid converter system 10 of FIG. 1 (e.g., bar 56).

Figure 3:
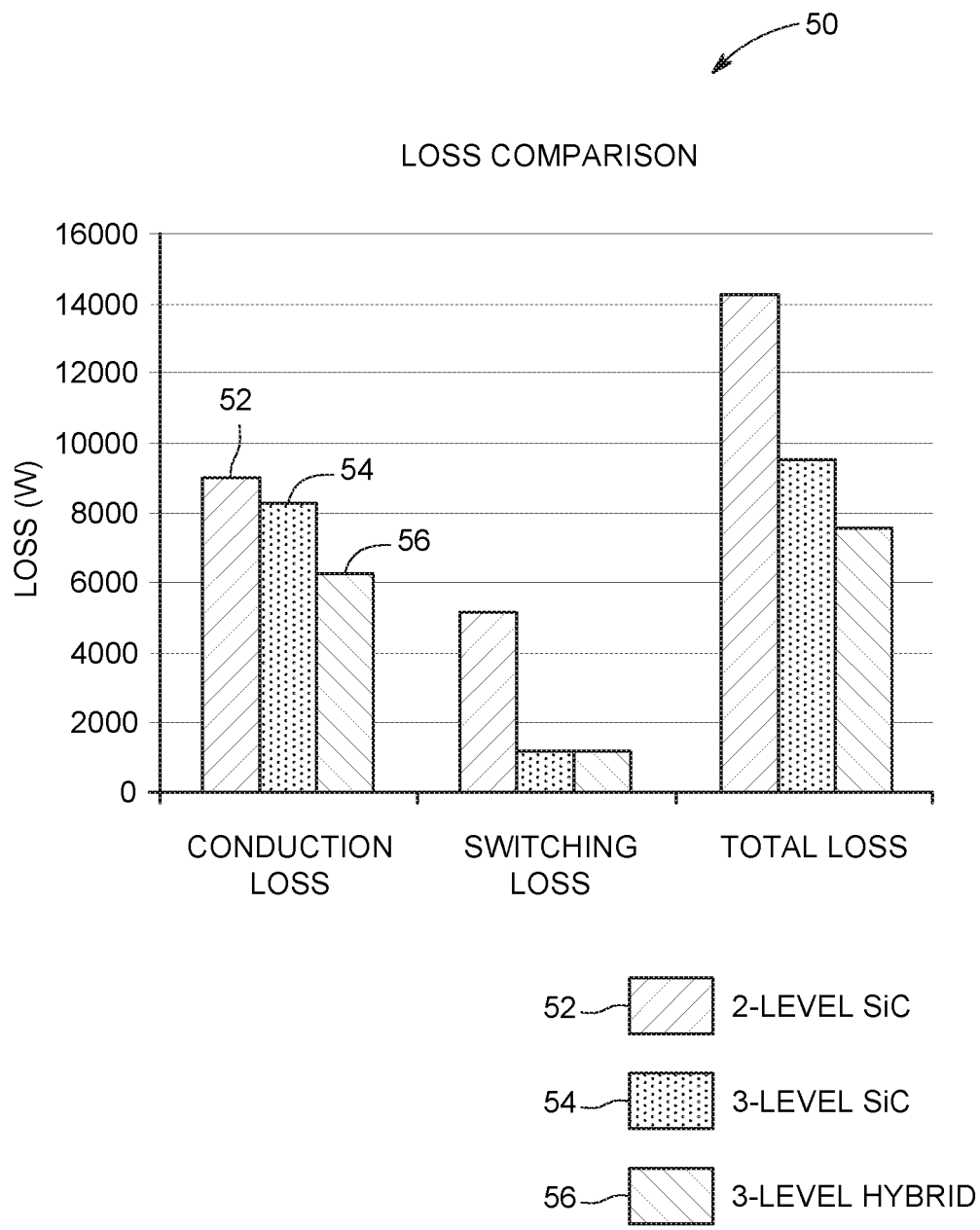
FIG. 3 illustrates a bar graph that compares energy losses for different types of converter systems, in accordance with an embodiment.

The graph 50 of FIG. 3 compares the losses that occur in a two-level converter system using just SiC power electronic devices (e.g., bar 52), a three-level converter system using just SiC power electronic devices (e.g., bar 54), and a three-level hybrid converter system that corresponds to the hybrid converter system 10 of FIG. 1 (e.g., bar 56) employed in a 1.5 MW/4.16 kV high-speed medium voltage drive. Moreover, the effective switching frequency at the AC voltage output terminal is approximately 20 kHz. The simulation associated with the graph 50 used a 1.7 kV SiC MOSFETs as the SiC MOSFETs 14 and 6.5 kV/250 A Si IGBTs as the Si IGBTs 12 as part of the hybrid converter system 10. As shown in the graph 50, the hybrid system 10 has a 20% reduction in total loss compared the full SiC 3-level converter, while also representing a reduction in component cost.

Figure 4:
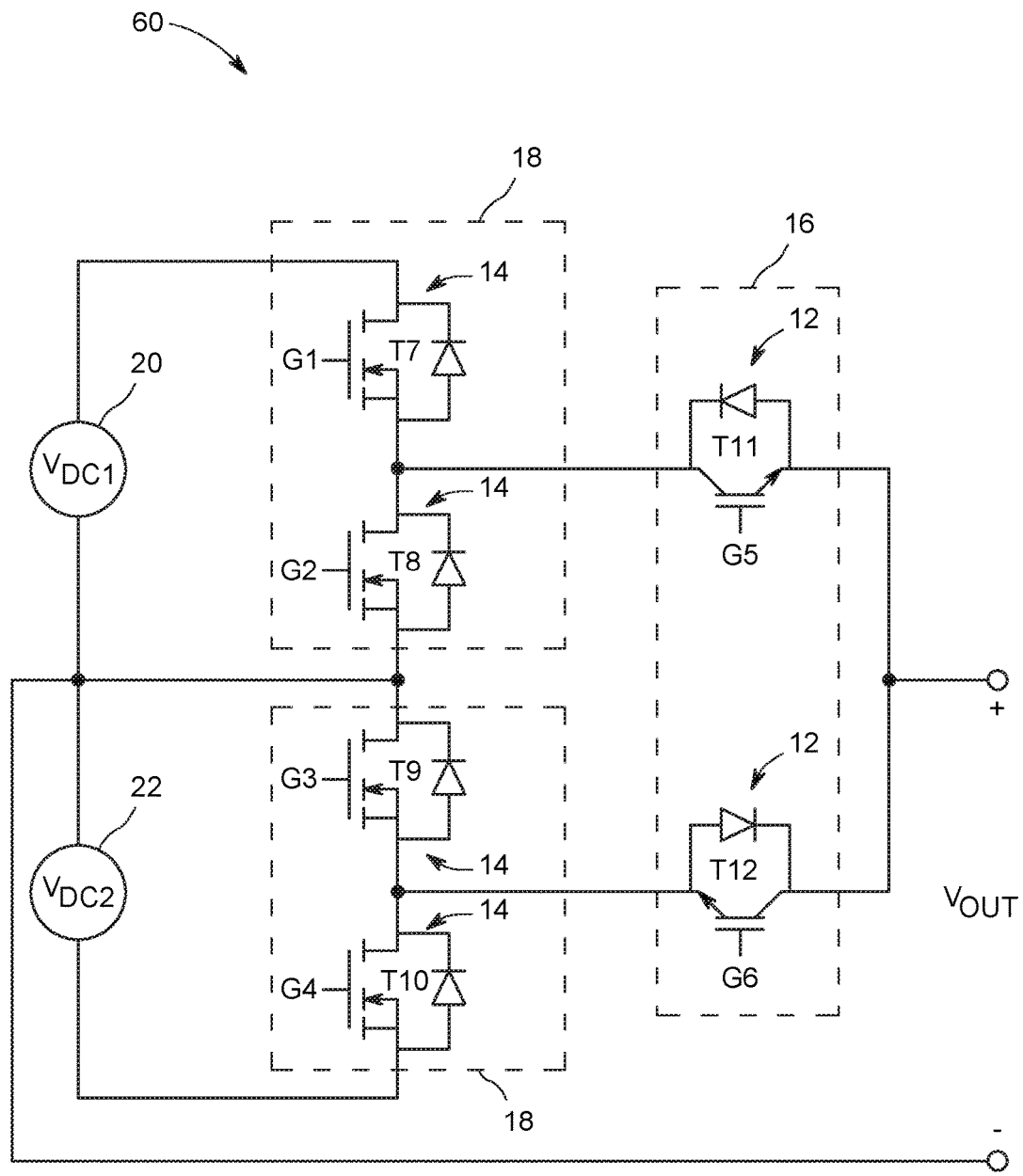
FIG. 4 is a schematic diagram of another three-level hybrid converter system, in accordance with an embodiment.

With the foregoing in mind, in some embodiments, the Si IGBTs 12 and the SiC MOSFETs 14 of the hybrid converter system 10 may be positioned in a different manner. For instance, FIG. 4 illustrates a schematic diagram of a three-level hybrid converter system 60 that switches the positions of the module 18 (including the SiC MOSFETs 14) and the module 16 (including the Si IGBTs 12), relative to the embodiment of the hybrid converter system 10 of FIG. 1. Like the hybrid converter system 10 discussed above, the hybrid converter system 60 may also be characterized as an active neutral point clamped multi-level converter.

In one embodiment, the hybrid converter system 60 may operate such that the SiC MOSFETs 14 switch in half of a fundamental cycle (e.g., 30 Hz), as compared to the Si IGBTs 12, which may switch at approximately the fundamental frequency (e.g., 60 Hz). Accordingly, the hybrid converter system 60 may have the same benefits with regard to switching losses as compared to the hybrid converter system 10 of FIG. 1. Moreover, like the hybrid converter system 10 of FIG. 1, a control system for the hybrid converter system 60 may coordinate gate signals provided to the SiC MOSFETs 14 and the Si IGBTs 12 in a similar manner described above to limit an amount of current present at the Si IGBTs 12 when the Si IGBTs 12 are scheduled to switch off or on.

Figure 5:
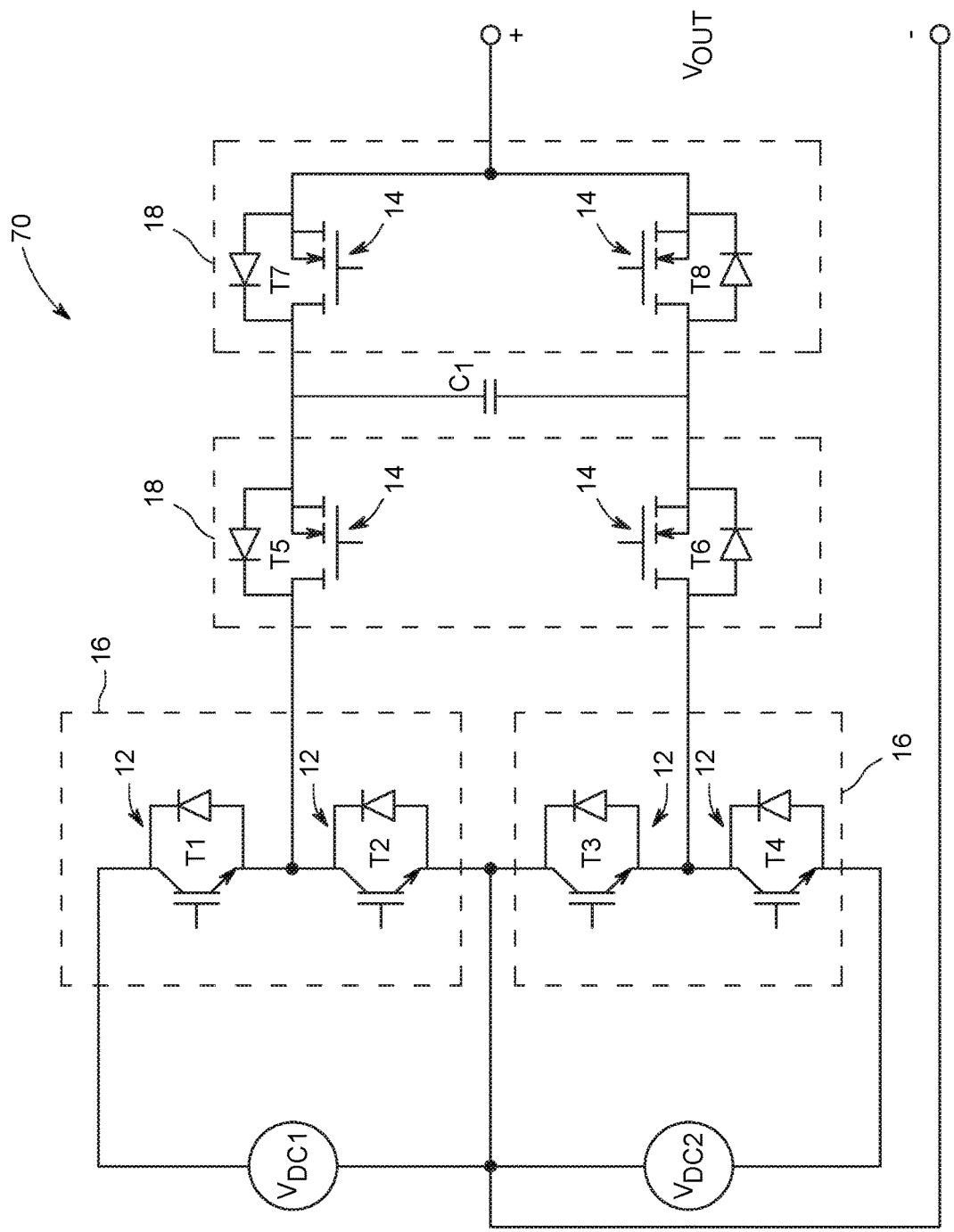
FIG. 5 is a schematic diagram of a five-level hybrid converter system, in accordance with an embodiment.

In addition to the three-level hybrid converter system 10 and the three-level hybrid converter system 60 described above, FIG. 5 illustrates a five-level hybrid converter system 70 that may also be employed to convert DC voltage signals into AC voltage signals. The hybrid converter system 70 may include the circuit of the hybrid converter system 10 described above, along with a capacitor 72 and an additional SiC MOSFET module 18.

Like the hybrid converter 10 discussed above, the Si IGBTs 12 of the hybrid converter 70 may be provided gate signals such that they switch at the fundamental frequency (e.g., 60 Hz). The SiC MOSFETs 14, on the other hand, may be provided gate signals to cause the SiC MOSFETs 14 to switch more frequently, resulting in higher switching frequencies (e.g., >1 kHz).

In certain embodiments, each of the Si IGBTs 12 of the hybrid converter system 70 may have a voltage rating that is approximately double or twice the voltage rating of the SiC MOSFET 14. As such, low voltage SiC MOSFETs 14 may be used to build a converter with a higher voltage rating. In this way, the hybrid converter system 70 may maintain relatively low conduction and switching losses as compared to converters that employ just SiC MOSFETs 14 or just Si IGBTs. For example, in the five-level converter, the Si IGBT voltage rating may be twice of SiC MOSFET voltage rating. Alternatively, low voltage SiC MOSFETs can be connected in series to achieve higher voltage.

Technical effects of the invention include combining the low switching loss benefits of SiC power electronic devices with the low conduction losses benefits of Si power electronic devices to provide an efficient converter system for converting voltages from a DC signal to an AC signal. Moreover, considering the relatively high costs associated with SiC power electronic devices as compared to Si power electronic devices, the presently disclosed embodiments provide a system that leverages the benefits of the SiC power electronic devices, while minimizing the number of SiC power electronic devices used in the system. As a result, the hybrid converter systems described herein provides a lower cost and better performance alternative as compared to a non-hybrid converter system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A voltage converter, comprising:
    a first set of silicon (Si)-based power devices coupled to a first direct current (DC) voltage source;
    a second set of Si-based power devices coupled to a second DC voltage source;
    a first set of silicon-carbide (SiC)-based power devices coupled to the first set of Si-based power devices and to the second set of Si-based power devices, wherein each SiC-based power device of the first set of SiC-based power devices is configured to switch at a higher frequency as compared to each Si-based power device of the first and second sets of the Si-based power electronic devices;
wherein Si-based power devices in the voltage converter are twice that of SiC-based power devices in the voltage converter;
wherein the voltage converter further comprises:
    a capacitor coupled to across the first set of SiC-based power devices;
    wherein the first set of SiC-based power devices is connected across a first output terminal of the first set of Si-based power devices and a second output terminal of the second set of Si-based power devices; and
    wherein the first and second output terminals of the first and second sets of Si-based power devices are obtained at interconnection points of Si-based power devices in the first and second sets respectively.

2. The voltage converter of claim 1, wherein each of the first and second sets of Si-based power devices comprises one or more insulated-gate bipolar transistors (IGBTs).

3. The voltage converter of claim 1, wherein the first set of SiC-based power devices comprises one or more metal-oxide-semiconductor field-effect transistors (MOSFETs).

4. The voltage converter of claim 1, comprising a processor configured to provide a plurality of gate signals to the first and second sets of Si-based power devices and the first set of SiC-based power devices, wherein the plurality of gate signals is configured to cause the first set of SiC-based power devices to switch at a higher frequency as compared to the first and second sets of Si-based power devices.

5. The voltage converter of claim 1, wherein each Si-based power device of the first and second sets of silicon-based power electronic devices is configured to switch at a fundamental frequency.

6. The voltage converter of claim 5, wherein the fundamental frequency is 60 Hz.

7. The voltage converter of claim 1, wherein each silicon-carbide-based power electronic device of the first set of silicon-carbide-based power electronic devices configured to switch at 1 kHz or more.

8. An apparatus configured to convert a direct current (DC) voltage signal into a alternating current (AC) voltage signal, comprising:
    a first set of silicon-carbide (SiC)-based power electronic devices coupled to a first direct current (DC) voltage source;
    a second set of SiC-based power electronic devices coupled to a second direct current (DC) voltage source;
    a first set of silicon (Si)-based power electronic devices coupled to the first set of SiC-based power electronic devices and to the second set of SiC-based power electronic devices, wherein each SiC-based power electronic device of the first and second sets of SiC-based power electronic devices is configured to switch at a higher frequency as compared to each Si-based power electronic device of the first set of the Si-based power electronic devices;
wherein SiC-based power devices in the voltage converter are twice that of Si-based power devices in the voltage converter;
wherein the apparatus further comprises:
    a capacitor coupled to across the first set of Si-based power devices;
    wherein the first set of Si-based power devices is connected across a first output terminal of the first set of SiC-based power devices and a second output terminal of the second set of SiC-based power devices; and
    wherein the first and second output terminals of the first and second sets of SiC-based power devices are obtained at interconnection points of SiC-based power devices in the first and second sets respectively.

9. The apparatus of claim 8, wherein the first set of Si-based power electronic devices comprises one or more insulated-gate bipolar transistors (IGBTs).

10. The apparatus of claim 8, wherein each of the first and second sets of SiC-based power electronic devices comprise one or more metal-oxide-semiconductor field-effect transistors (MOSFETs).

11. The apparatus of claim 8, wherein the first set of Si-based power electronic devices comprises at least two insulated-gate bipolar transistors (IGBTs) coupled in series with each other.

12. The apparatus of claim 8, wherein each of the first and second sets of SiC-based power electronic devices comprise at least two metal-oxide-semiconductor field-effect transistors (MOSFETs) coupled in series with each other.

13. The apparatus of claim 8, wherein each Si-based power electronic device of the first set of silicon-based power electronic devices is configured to switch at a fundamental frequency.

14. The apparatus of claim 8, wherein each SiC-based power electronic device of the first and second sets of SiC-based power electronic devices is configured to switch in half a fundamental cycle.

15. A voltage converter, comprising:
a first set of silicon (Si)-based power devices coupled to a first DC voltage source;
a second set of Si-based power devices coupled to a second DC voltage source;
a first set of silicon-carbide (SiC)-based power devices coupled to the first set of Si-based power devices and to the second set of Si-based power devices;
a processor configured to control switching of each SiC-based power device of the first set of SiC-based power devices and each Si-based power device of the first and second sets of the Si-based power devices such that one SiC-based power device of the first set of SiC-based power electronic devices is conducting current in series with one Si-based power electronic device of the first or second set of the silicon-based power electronic devices at any given time;
wherein Si-based power devices in the voltage converter are twice that of SiC-based power devices in the voltage converter;
wherein the voltage converter further comprises:
a capacitor coupled to across the first set of SiC-based power devices;
wherein the first set of SiC-based power devices is connected across a first output terminal of the first set of Si-based power devices and a second output terminal of the second set of Si-based power devices; and
wherein the first and second output terminals of the first and second sets of Si-based power devices are obtained at interconnection points of Si-based power devices in the first and second sets respectively.

16. The voltage converter of claim 15, wherein the processor is configured to remove a first gate signal from a first Si-based power device of the first set of the Si-based power devices and provide a second gate signal to a second Si-based power device of the second set of the Si-based power devices.

17. The voltage converter of claim 16, wherein the processor is configured to remove the first signal and provide the second signal when a voltage output of the converter crosses zero.

18. The voltage converter of claim 15, wherein each of the first and second sets of Si-based power devices comprises one or more insulated-gate bipolar transistors (IGBTs).

19. The voltage converter of claim 15, wherein the first set of SiC-based power devices comprises one or more metal-oxide-semiconductor field-effect transistors (MOSFETs).

20. The voltage converter of claim 1, wherein gate signals provided to the Si based power devices and the SiC based power are such that one Si based power device is activated together in electrical series with one SiC based power device at any given time.

21. The voltage converter of claim 20, wherein the said one SiC based power device is in a non-conductive state sooner than its corresponding said one Si based power device and further the said one SiC based devices is not be turned on until corresponding said one Si based device is in ON state.

* * * * *